(12) United States Patent  (10) Patent No.: US 8,540,000 B2
Okazaki  (45) Date of Patent: Sep. 24, 2013

(54) CURING PROCESSING DEVICE AND LAMINATING SYSTEM

(75) Inventor: Shizuaki Okazaki, Hiroshima (JP)

(73) Assignee: Kitagawa Seiki Kabushiki Kaisha, Hiroshima (JP)

( * ) Notice: Subject to any disclaimer, the term of this patent is extended or adjusted under 35 U.S.C. 154(b) by 29 days.

(21) Appl. No.: 13/417,520

(22) Filed: Mar. 12, 2012

(65) Prior Publication Data

US 2012/0168085 A1 Jul. 5, 2012

Related U.S. Application Data

(63) Continuation-in-part of application No. PCT/JP2010/063484, filed on Aug. 9, 2010.

(30) Foreign Application Priority Data

Sep. 10, 2009 (JP) ................................. 2009-209477

(51) Int. Cl.
*B32B 37/00* (2006.01)
(52) U.S. Cl.
USPC ......... 156/358; 156/362; 156/382; 156/583.1
(58) Field of Classification Search
USPC ................. 156/358, 362, 381, 382, 580, 581, 156/583.1, 583.3
See application file for complete search history.

(56) References Cited

U.S. PATENT DOCUMENTS

| 5,993,582 | A | 11/1999 | Yoshino et al. | |
|---|---|---|---|---|
| 7,311,798 | B2 * | 12/2007 | Colson et al. | 156/583.5 |
| 7,819,165 | B2 * | 10/2010 | Hashizume et al. | 156/583.1 |
| 2008/0041531 | A1 | 2/2008 | Chikaki | |

FOREIGN PATENT DOCUMENTS

| JP | 61-024426 | 2/1986 |
|---|---|---|
| JP | 63-33923 | 3/1988 |
| JP | 10-65191 | 3/1998 |
| JP | 11-238898 | 8/1999 |
| JP | 2004-179261 | 6/2004 |
| JP | 2004-193317 | 7/2004 |
| JP | 2004-200518 | 7/2004 |
| JP | 2006-088511 | 4/2006 |
| JP | 2008-47765 | 2/2008 |

* cited by examiner

*Primary Examiner* — James Sells
(74) *Attorney, Agent, or Firm* — McCarter & English, LLP

(57) ABSTRACT

A curing processing device including a top moving plate, a bottom moving plate, an intermediate moving plate, a heating unit which heats each of the moving plates, a moving plate driving unit, a carrying unit, and a controller, and wherein each of the top moving plates includes an elastic film and a positive pressure applying unit applying a positive pressure to a space between the moving plate and the elastic film, and the controller is configured to cause the curing processing device to operate in a carrying mode for carrying in or out the solar battery assembly and a compress mode for applying a positive pressure to a space between a lower surface of an upper side moving plate and the elastic film to press the solar batter assembly, and the controller changes a pair of moving plates in a predetermined order each time the mode is switched.

9 Claims, 7 Drawing Sheets

CURING PROCESSING DEVICE AND LAMINATING SYSTEM

This is a Continuation-in-Part of International Application No. PCT/JP2010/063484 filed Aug. 9, 2010, which claims priority from Japanese Patent Application No. 2009-209477 filed Sep. 10, 2009. The entire disclosure of the prior application is hereby incorporated by reference herein its entirety.

TECHNICAL FIELD

The present invention relates a curing processing device and a laminating system for manufacturing a laminate structure, such as a solar battery panel.

BACKGROUND

Solar battery panels are used under outdoor environment where the temperature fluctuates severely. Therefore, in order to enhance the thermal stability, the solar battery assembly after forming is subjected to a long-time heat treatment (a curing process). As a device for a curing process, a multistage stocker type curing oven device as described in Japanese Patent Provisional Publication No. HEI 11-238898A is known. By using such a multistage stocker type curing oven device, it becomes possible to subject a plurality of solar battery assemblies to the curing process simultaneously, and to effectively perform the curing process which requires a long time.

SUMMARY

The curing oven device described in HEI 11-238989A is configured to heat the lamination materials through radiation from an internal heater and thermal propagation of heated air. Therefore, the curing process by the curing oven device is not effective in regard to the thermal propagation to the lamination materials, and requires a long time. Furthermore, in order to heat the solar battery assembly uniformly, the solar battery assembly needs to be kept at a certain distance from the heater. Therefore, the curing oven device has a drawback that the thermal efficiency of heating of the lamination materials is low.

The present invention is made in consideration of the above described circumstances. The feature of the present invention is advantageous in that it provides a curing processing device capable of effectively performing a curing process in a high degree of thermal efficiency and in a short time.

According to an embodiment of the present invention, there is provided a curing processing device executing a curing process for a solar battery assembly formed by performing laminate press for stacked structural components of a solar battery so as to heat the solar battery assembly and thereby to thermally stabilize the solar battery assembly. The curing processing device includes a top moving plate; a bottom moving plate arranged under the top moving plate; at least one intermediate moving plate arranged between the top moving plate and the bottom moving plate; a heating unit which heats each of the top moving plate, the bottom moving plate and the at least one intermediate moving plate; a moving plate driving unit which drives the bottom moving plate in a vertical direction; a carrying unit which arranges the solar battery assembly at a position between the moving plates, and retrieves the solar batter assembly from the moving plates; and a controller. Each of the top moving plate and the at least one intermediate moving plate includes an elastic film on a lower surface thereof and a positive pressure applying unit which applies a positive pressure to a space between the lower surface and the elastic film. The controller is configured to cause the curing processing device to operate in a carrying mode in which the controller selects a pair of moving plates, adjoining in a vertical direction, from the top moving plate, the at least one intermediate moving plate and the bottom moving plate, selectively increases an interval between the selected pair of moving plates, and carries in or carries out the solar battery assembly to or from a position between the pair of moving plates, and a compress mode in which the bottom moving plate is moved upward so that the solar battery assembly is sandwiched between the pair of moving plates and then, by driving the positive pressure applying unit, a positive pressure is applied to the space between a lower surface of an upper side moving plate and the elastic film of the upper side moving plate to cause the elastic film to press the solar batter assembly. The controller changes a pair of moving plates selected in the carrying mode in a predetermined order each time the carrying mode and the compress mode is switched.

By executing the curing process with the above described curing processing device, the solar battery panel is heated while being sandwiched between the heated lower side moving plate and the elastic film heated by the upper side moving plate. Since the solar battery assembly is heated through contact with the moving plate and the elastic film, it becomes possible to perform the curing processes in a short time in comparison with the case where a curing oven is used. Furthermore, since the solar battery assembly is located to be close to the moving battery being a heat source, heat from the moving plate propagates effectively from the moving plate to the solar battery assembly, and the degree of loss of thermal energy becomes small.

The curing processing device may further include a moving plate holding unit which fixes one of the al least one intermediate moving plate and the top moving plate so that the one of the at least one intermediate moving plate and the top moving plate is prevented from becomes lower than or equal to a predetermined height. In this case, in the carrying mode, the controller controls the moving plate holding unit so that an upper side moving plate of the selected pair of moving plate is fixed, and the interval between the selected pair of moving plates is increased by lowering the bottom moving plate.

By employing the moving plate holding unit as described above, it becomes unnecessary to provide a plurality of mechanisms for driving the very heavy moving plates. As a result, the curing processing device configured to be compact is size and inexpensive can be realized.

For example, in some embodiments, a hole is formed on a side surface of each of the at least one intermediate moving plate and the top moving plate to extend in a substantially horizontal direction, and the moving plate holding unit comprises a fixed part fixed at the predetermined height, a rod configured to be retractable with respect to the fixed part, and a driving unit which drives the rod. In this case, each moving plate is fixed at the predetermined height by causing the rod to protrude from the fixed part and thereby to be inserted into the hole of each moving plate.

As described above, the configuration in which the moving plate is held through engagement between a recessed part (a hole) and a projected part (a rod) does not require energy for holding a heavy weight moving plate. Furthermore, since a complicated mechanism is not necessary, it is possible to provide a moving plate holding unit which is firm and inexpensive.

In some embodiments of the invention, the carrying unit includes a conveyer provided at both sides of the solar battery assembly in a width direction which is perpendicular to a carrying direction of the solar batter assembly and the vertical direction. The conveyer is movable between a carrying position where the conveyer is able to carry the solar battery assembly and a retracted position which is shifted from the carrying position in the width direction and at which the conveyer does not interfere with the solar battery assembly. The controller moves the conveyer to the retracted position after the solar batter assembly is moved to a position on each moving plate from the conveyer.

According to an embodiment of the invention, there is provided a curing processing device for executing a curing process for a lamination body formed by performing laminate press for stacked structural components of a laminate structure body so as to heat and stabilize the lamination body. The curing processing device includes: a top moving plate; a bottom moving plate arranged under the top moving plate; at least one intermediate moving plate arranged in a vertical direction between the top moving plate and the bottom moving plate; a diaphragm arranged between the moving plates; a moving plate interval elongation mechanism which moves a pair of moving plates, which are adjacent ones of the top moving plate, the bottom moving plate and the at least one intermediate moving plate, to depart from each other; and an inner pressure control unit which controls an inner pressure of a chamber which is formed between the moving plates when the pair of moving plates do not departed from each other and which is comparted by the diaphragm. At least one of the pair of moving plates includes a heater, and the curing process is performed by sandwiching the lamination body between the diaphragm and the at least one of the pair of moving plates including the heater while controlling the inner pressure.

By using the above described curing processing device, the curing process is performed in the state where the diaphragm closely contacts the heated moving plate. Therefore, the lamination body can be heated rapidly in a state of uniform temperature.

The moving plate interval elongation mechanism may include: a moving plate driving unit which drives the bottom moving plate in the vertical direction; and a holding unit which holds one of the top moving plate and the at least one intermediate moving plate at a predetermined height.

Typically, the moving plate interval elongation mechanism causes the moving plate driving unit to move an upper side one of the pair of moving plates adjacent to each other to the predetermined height while driving the bottom moving plate, causes the holding unit to hold the upper side one of the pair of moving plates at the predetermined height, and causes the pair of moving plates adjacent to each other to depart from each other by causing the moving plate driving unit to lower the other of the pair of moving plates while driving the bottom moving plate.

By employing the holding unit as described above, it becomes unnecessary to employ a plurality of mechanisms for driving the heavy weight moving plates. As a result, a device which is compact is size can be realized.

Typically, the laminate structure body is a solar battery, and the lamination body is a solar battery assembly formed by stacking components of the solar battery.

DETAILED DESCRIPTION OF EMBODIMENTS

Figure 1:
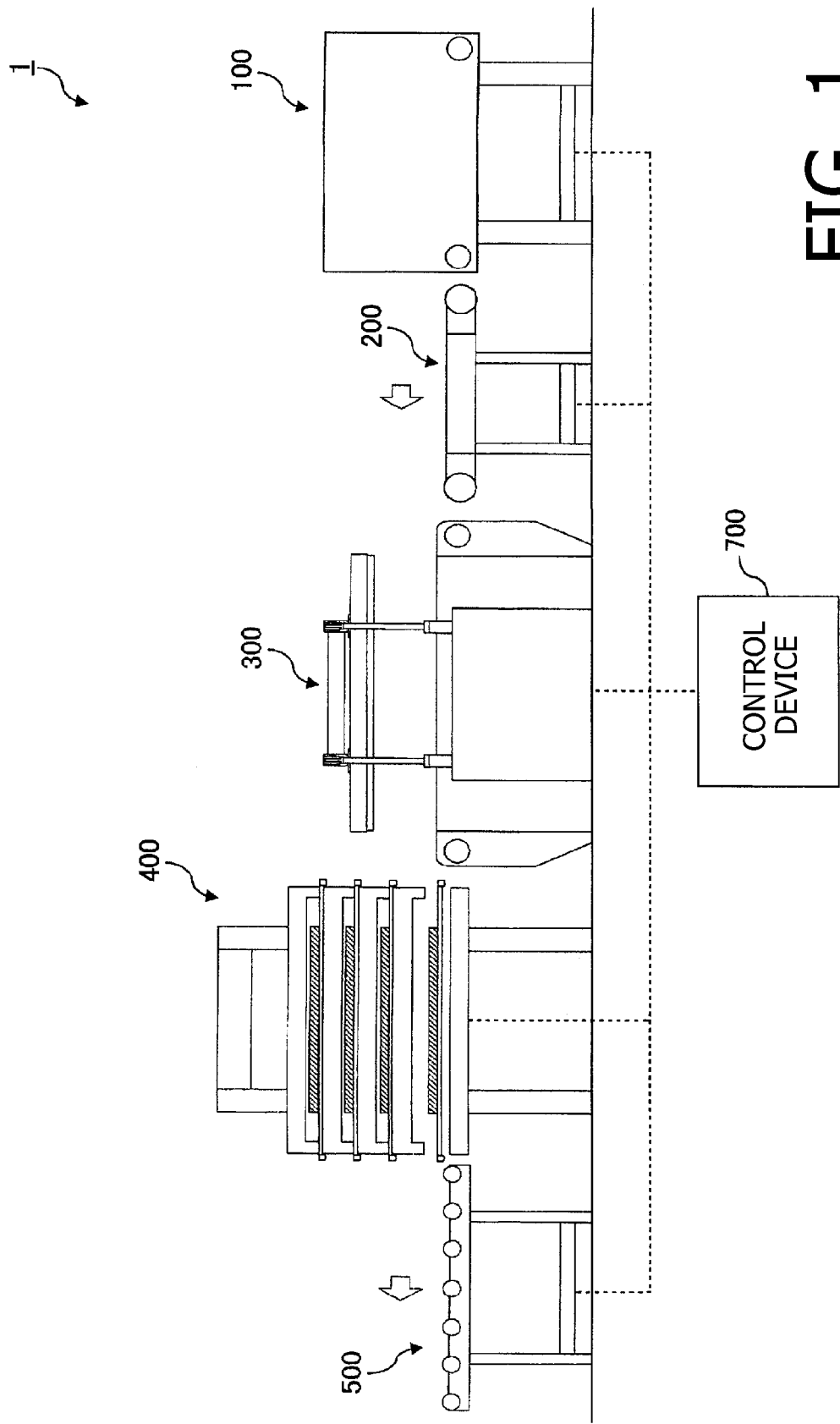
FIG. 1 illustrates an outer appearance of a laminating system according to an embodiment of the present invention.

In the following, an embodiment of the invention is explained with reference to the accompanying drawings. FIG. 1 illustrates an outer appearance of a solar battery laminating system 1 according to the embodiment of the invention. The laminating system 1 includes a lamination device 100, a carrying-in conveyer 200, a laminate press device 300, a curing processing device 400, a carrying-out conveyer 500 and a control device 700. The laminating system 1 is connected via a communication cable to each component constituting the laminating system 1, and controls the operation of each component.

The lamination device 100 is configured to assemble a solar battery assembly A by overlaying a plurality of components (e.g., a glass plate, a filler, a solar battery cell, a tiller and a rear plate) constituting a solar battery. The solar battery assembly A assembled by the lamination device 100 is carried to the laminate press device 300 by the carrying-in conveyer 200. The laminate press device 300 hot-presses the solar battery assembly A to from a plate-like body having a predetermined thickness. The hot-pressing by the laminate press device 300 continues until the fluid nature of the tiller at the press temperature disappears. The solar battery assembly A after forming is carried to the curing device 400 by a carrying unit accommodated in the laminate press device 300.

The curing device 400 performs a curing process in which the solar battery assembly A formed by the laminate press device 300 is heated while applying a light pressure to maintain the shape to the solar battery assembly A, so that the filler of the solar battery assembly A which is a heat-hardening resin is stabilized. Through the above described processes, a solar battery panel is made. The completed solar battery panel which has been subjected to the curing process is carried out from the laminating system 1 by the carrying-out conveyer 500.

Figure 2:
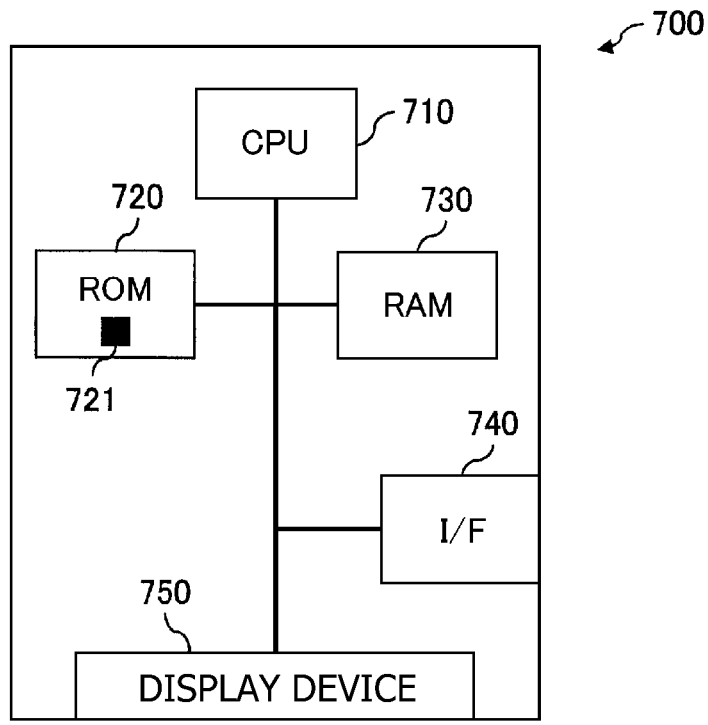
FIG. 2 is a block diagram generally illustrating a configuration of a control device of according to the embodiment of the invention.

The above described sequence of processes is performed by controlling the lamination device 100, the carrying-in conveyer 200, the laminate press device 300, the curing processing device 400 and the carrying-out conveyer 500 by the control device 700. FIG. 2 is a block diagram generally illustrating a configuration of the control device 700. The control device 700 includes a ROM (Read-Only Memory) 720 storing a control program 721 for controlling the laminating system 1, a CPU (Central Processing Unit) 710 which reads and executes a program stored in the ROM 720, a RAM (Random-Access Memory) 730 which is a main memory, a communication interface 740 for communicating with each of the components constituting the laminating system 1, and a display device 750 which is a touch panel display which displays an operating state of the laminating system 1 and receives a user input. The control program 721 according to the embodiment includes a sub-program for executing control of a laminate press process executed (FIG. 6) by the laminate press device 300, a curing process (FIG. 8) executed by the curing device 400 as well as control for cooperation between the devices, such as a timing adjustment of handing over of a work piece, and the laminate press process and the curing process are executed under control of the control device 700.

In this embodiment, the solar battery assembly A and the sola battery panel after processing are carried while being placed on a carrier plate 800 which is explained later, and are pressed together with the carrier plate 800 by the laminate press device 300 and the curing device 400.

Figure 3:
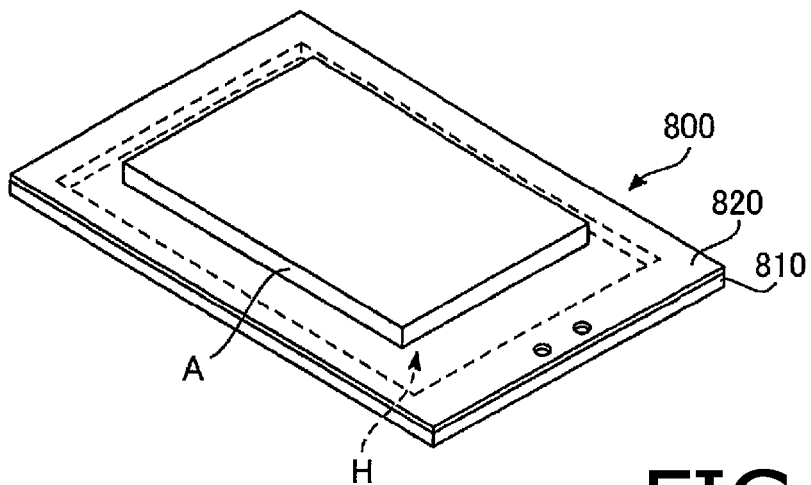
FIG. 3 is a perspective view of a carrier plate according to the embodiment of the invention.

FIG. 3 is a perspective view of the carrier plate 800 used in this embodiment. The carrier plate 800 according to the embodiment includes a frame body 810 having a hollow part H formed in a central portion thereof; and a thin plate 820 fixed to a top face of the frame body 810 to cover the hollow part H. The thin plate 820 is fixed to the frame body 810, for example, with an adhesive.

The frame body 810 is a structural material having an adequate degree of rigidity to the extent that the frame body 810 does not substantially deform in the manufacturing process of a solar battery panel. In addition, the frame body 810 is made of metal or heat resisting resin (e.g., polyimide resin) so as to maintain an adequate degree of rigidity also during the hot-pressing. In this embodiment, the frame body 810 formed through a bending process of a stainless steel plate is used.

The thin plate 820 is a support member having flexibility and a low degree of rigidity so as to elastically hold and protect the solar battery cell and the glass plate, which are brittle members. The thin plate 820 is made of heat resisting materials, such as a fluorocarbon resin sheet, a fiber reinforced heat resisting resin sheet or a metal thin plate (e.g., a stainless steel plate or a copper plate), having an adequate degree of strength under a high temperature condition so as not to be damaged even when the hot-pressing is repeated. In addition, the thickness of the thin plate 820 is set to be within a range achieving a balance between durability and flexibility. For example, when the thin plate 820 made of carbon-fiber reinforced plastic based on polyimide is used, the thickness of the thin plate 820 is set to be within the range of 0.05 to 1.5 mm, and preferably within the range of 0.5 to 1.0 mm.

Although a peripheral part of the thin plate 820 has lost flexibility because the peripheral part is lined with the frame body 810, the central portion thereof facing the hollow part H maintains flexibility. The solar battery assembly A is placed on the central part of the thin plate 820 having flexibility, and is supported flexibly by the thin plate 820. When the carrier plate 800 is carried by the carrying units, such as the carrying-in conveyer 200 and the carrying-out conveyer 500, the frame body 810 is supported by the carrying units. Therefore, the solar battery assembly A placed on the carrier plate 800 is prevented from receiving a strong shock during the carrying, and thereby the solar battery assembly A being carried is prevented from being damaged.

Figure 4:
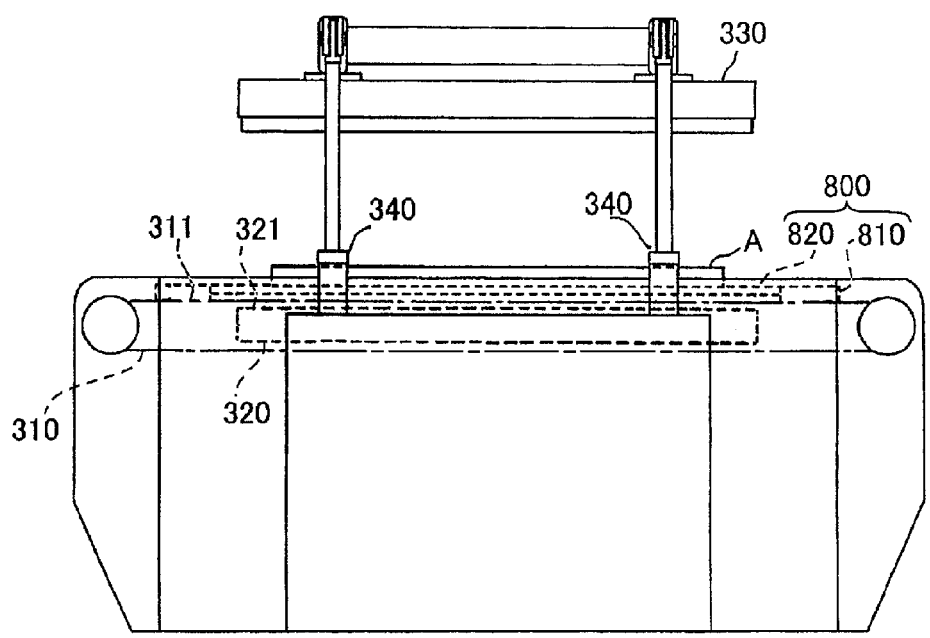
FIG. 4 is a side view of a laminate press device according to the embodiment of the invention.

Next, the configuration of the laminate press device 300 is explained. FIG. 4 is a side view of the laminate press device 300. The laminate press device 300 includes a pair of conveyers 310 for carrying the carrier plate 800 on which the solar battery assembly A is placed (in FIG. 4, only one conveyer on the near side is illustrated). In the following explanation, the direction in which the carrier plate 800 on which the solar battery assembly A is placed is carried (the left and right direction in FIG. 4) is referred to as a "carrying direction", and the horizontal direction (a direction perpendicular to the paper face of FIG. 4) perpendicular to the carrying direction is referred to as a "width direction". The pair of conveyers 310 is arranged along the width direction.

Between the pair of conveyers 310, a fixed plate 320 is arranged. Above the fixed plate 320, a moving plate 330 is provided. The fixed plate 320 is fixed to a frame of the laminate press device 300. The moving plate 330 is fixed to the frame via cylinder units 340, and can be driven in the vertical direction by the cylinder units 340. In a state where the carrier plate 800 on which the solar battery assembly A is placed is situated on the fixed plate 320, and then the moving plate 330 is lowered so that the solar battery assembly A is sandwiched between the moving plate 330 and the fixed plate 320, laminate press of the solar battery assembly A using a diaphragm 333 which is described later is performed. In order to prevent the fixed plate 320 from interfering with the frame body 810 of the carrier plate 800, the size of the fixed plate 320 in the width direction and the depth direction is set so that the entire top face of the fixed plate 320 is accommodated in the hollow part H (see FIG. 3) of the carrier plate 800.

The conveyer 310 is arranged to be movable in the vertical direction by an actuator not shown. When the conveyer 310 carries the carrier plate 800 on which the solar battery assembly A is placed, a top face 311 of the conveyer 110 is moved to a position which is higher than a top face 321 of the fixed plate 320. Therefore, the carrier plate 800 and the solar battery assembly A are carried without interfering with the fixed plate 320. On the other hand, when the laminate press is performed for the solar battery assembly A, the top face 311 of the conveyer 310 is moved to a position lower than the top face 321 of the fixed plate 320, and the thin plate 820 of the carrier plate 800 is directly placed on the top face 321 of the fixed plate 320. At this time, the frame 810 is brought to a state where the frame body 810 hangs from the top face 321 of the fixed plate 320 via the thin plate 820.

Next, a laminate press method for the solar battery assembly A by the fixed plate 320 and the moving plate 330 is explained. FIGS. 5(a) to (e) are cross sections of the fixed plate 320 and the moving plate 330 during the laminate press viewed along a plane perpendicular to the carrying direction. FIG. 6 is a flowchart illustrating the laminate press process.

Figure 5:
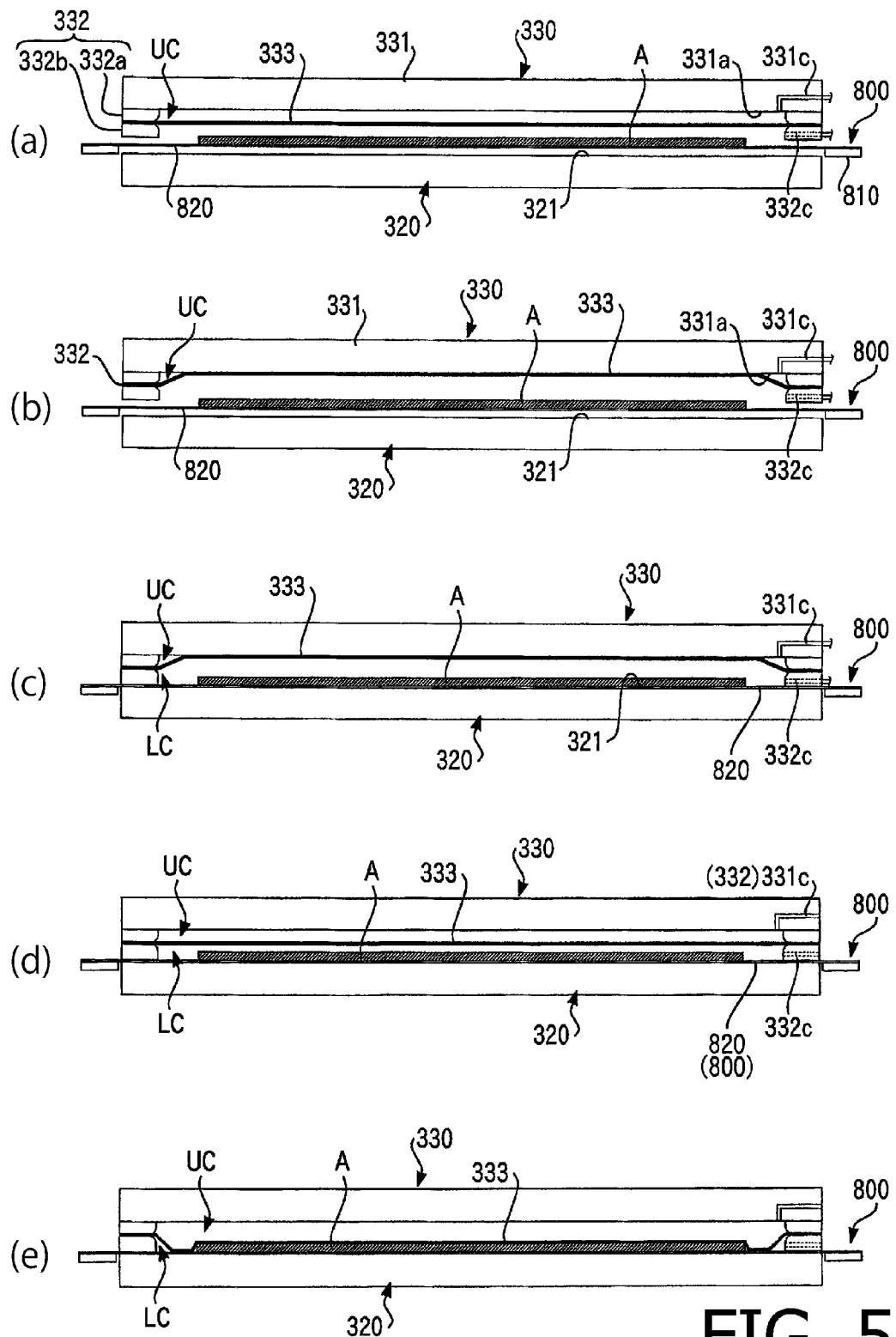
FIG. 5 is a cross sectional view of a fixed plate and a moving plate of the laminate press device according to the embodiment of the invention.
Figure 6:
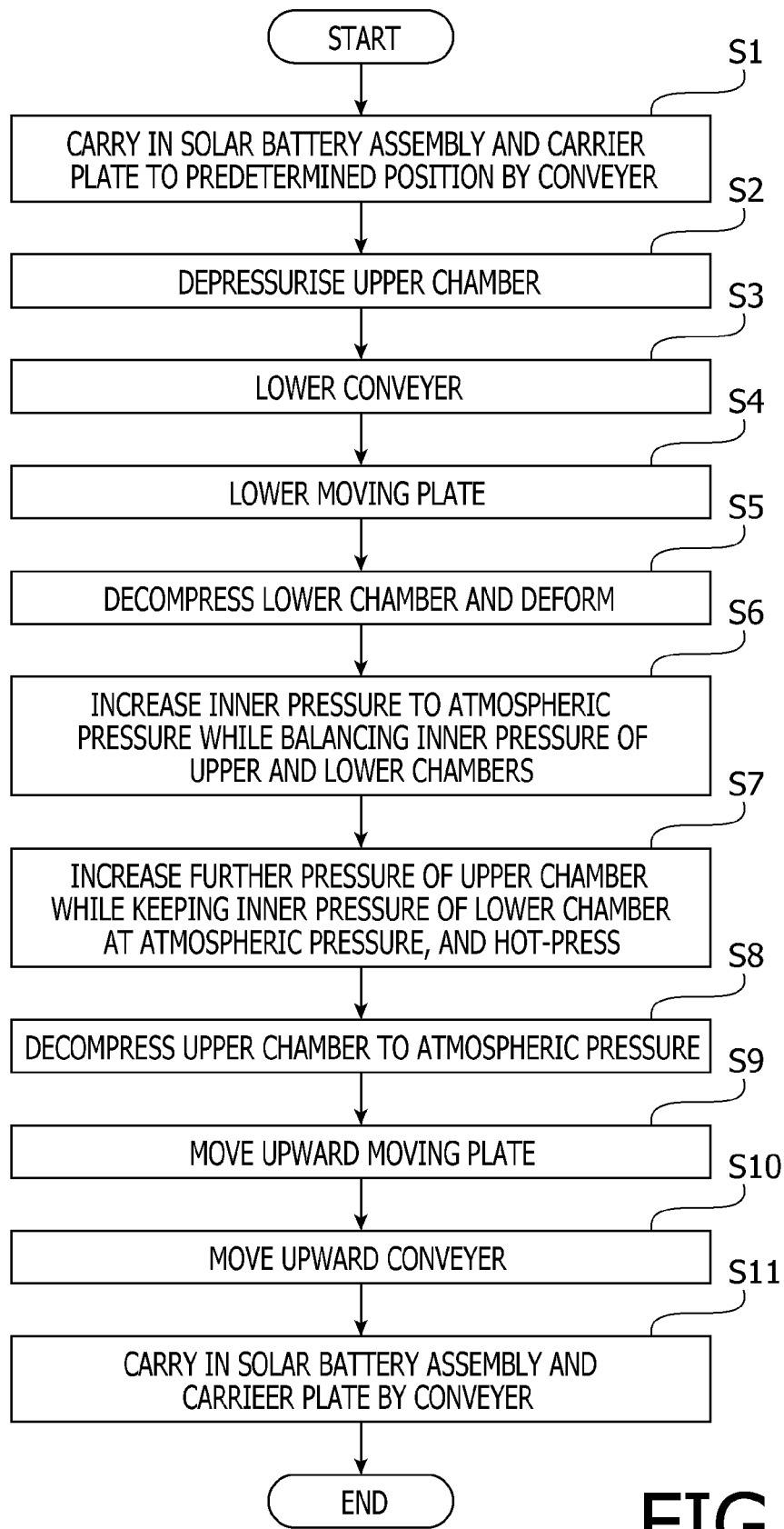
FIG. 6 is a flowchart illustrating a process of laminate press according to according to the embodiment of the invention.

As shown in FIG. 5, the moving plate 330 includes a moving plate body 331 and a frame body 332 attached to a lower surface 331a of the moving plate body 331. The frame body 332 is made of an elastic material, such as heat resisting rubber. The frame body 332 includes an upper frame body 332a and a lower frame body 332b. Between the upper frame body 332a and the lower frame body 332b, the diaphragm 333 for sealing an opening of the frame body 332 is sandwiched. The diaphragm 333 is a sheet-like member having flexibility, airtightness and a heat resisting property, and is jointed to the upper frame body 332a and the lower frame body 332b with an adhesive in a hermetic sealing manner. With this configuration, in the moving plate body 331, an upper chamber UC is formed by the diaphragm 333, the lower surface of the moving plate body 331 and the frame body 332 (specifically, the upper frame body 332a). In the moving plate body 331, a communicating path 331c is formed to connect the upper chamber UC with the outside space. Openings of the communicating path 331c are formed on the lower surface 331a and a side face of the moving plate body 331. A vacuum pump and a compressor (or a high pressure gas container) not shown are connected to the opening of the communicating path 331c formed on the side face of the moving plate body 331, so that the inner pressure of the upper chamber UC can be increased or decreased.

Heaters not shown are accommodated in the moving plate body 331 and the fixed plate 320, and the moving plate body 331 and the fixed plate 320 are maintained at a temperature required for heating the solar battery assembly A to the forming temperature.

Before the laminate press is performed, first the carrier plate 800 on which the solar battery assembly A is placed is carried to a position between the moving plate 330 and the fixed plate 320 by the carrying-in conveyer 200 (S1). FIG. 5(a) illustrates a state after completion of step S1.

Next, the pressure of the upper chamber UC is decreased by the vacuum pump connected to the communicating path 331c of the moving plate body 331 (S2). FIG. 5(b) illustrates a state after completion of step S2. As shown in FIG. 5(b), the volume of the upper chamber UC reduces due to the difference between the inner pressure of the upper chamber UC and the atmospheric pressure. That is, the diaphragm 33 protrudes toward the upper chamber UC and contacts the lower surface 331a of the moving plate body 331. Due to this contact, the heat rapidly moves from the moving plate body 331 to the diaphragm 333, and the diaphragm 33 is heated to the forming temperature for the solar battery assembly A.

Next, as shown in FIG. 5(c), the conveyer 310 (FIG. 4) is lowered (S3), and the thin plate 820 of the carrier plate 800 is placed on the fixed plate 320. Then, the moving plate 300 moves downward, and the thin plate 820 of the carrier plate 800 is brought to the state of being sandwiched between the lower surface of the frame body 332 and the upper surface 321 of the fixed plate 320 (S4). The frame body 332 formed of elastic material closely contacts the thin plate 320. That is, the frame body 332 functions as a packing, and a lower chamber LC is formed to be sealed by the thin plate 820 of the carrier plate 800, the frame body 332 and the diaphragm 333. A communicating path 332c is formed in the lower frame body 332b of the frame body 332 to penetrate therethrough in the horizontal direction. To an opening of the communicating path 332c formed on an outer side face of the lower frame body 332b, a vacuum pump and a compressor (or a high pressure gas container) not shown are connected, so that the inner pressure of the lower chamber LC can be increased or decreased. It should be noted that until step S4, the communicating path 332c is opened to the atmospheric air, and the inside of the lower chamber LC is kept at the atmospheric pressure. The upper chamber UC is kept at a negative pressure, and the diaphragm 333 is continuously heated by the moving plate body 331.

Next, the pressure in the lower chamber LC is decreased to become substantially equal to the inner pressure of the upper chamber UC by the vacuum pump connected to the communicating path 332c of the lower frame body 332b, and the lowered pressure state is maintained for a certain time period (S5). At this time, since the inner pressure of the upper chamber UC and the inner pressure of the lower chamber LC become substantially equal to each other, the diaphragm 333 returns to the natural state having a substantially flat shape. In addition, since the diaphragm 33 departs from the lower surface 331a of the moving plate body 331, the diaphragm 333 is brought to a state of not being heated. However, since the insides of the upper chamber UC and the lower chamber LC are close to the vacuum state, the heat-releasing amount from the diaphragm 333 is small, and therefore the temperature of the diaphragm 333 hard to decrease and is maintained at a substantially constant temperature. At this time, the solar battery assembly A contacts the heated fixed plate 320 via the thin plate 820 of the carrier plate 800. Therefore, heat rapidly moves from the fixed plate 320 to the solar battery assembly A, and the temperature of the solar battery assembly A rapidly increases to the forming temperature and the filler included in the solar battery assembly A gets soft. Furthermore, since the ambient pressure of the solar battery assembly A (inside of the lower chamber LC) has become a low pressure close to the vacuum state, bubbles in the softened filler are released, and thereby the filler is defoamed in a short time. At this time, since the inner pressure of the upper chamber UC and the inner pressure of the lower chamber LC are substantially equal to each other, the solar battery assembly A is prevented from being pressed by the diaphragm 333 due to an inner pressure difference. Therefore, the filler is prevented from flowing out from an edge of the solar battery assembly A together with expanding bubbles when the solar battery assembly A in which the filler is softened is pressed in the vacuum state, as in the case of the conventional diaphragm type laminate press device. During depressurizing of the lower chamber LC, the lower chamber LC is maintained to have an inner pressure higher than the inner pressure of the upper chamber UC. Therefore, during depressurizing of the lower chamber LC, the diaphragm 333 does not press the solar battery assembly A. During depressurizing of the lower chamber LC, the filler of the solar battery assembly A is in a softened state due to the heat propagating from fixed plate 320. At this state, the filler contains a number of bubbles, and the bubbles in the filler expand in accordance with decrease of the inner pressure of the lower chamber LC. If the solar battery assembly A being in such a state is pressed, a phenomenon that the softened filler flows out from an edge of the solar battery assembly A would easily occur due to combination of the pressure applied to the filler by the pressing and the pressure applied to the filler by the expansions of the bubbles. Therefore, by achieving the configuration where the solar battery assembly A is not pressed during depressurizing of the lower chamber LC, it becomes possible to prevent the filler from flowing out from an edge of the solar battery assembly A.

Next, the inner pressures of the upper and lower chambers UC and LC are increased gradually while maintaining the inner pressures of the upper and lower chambers UC and LC to be substantially equal to each other (S6). At this time, since there is almost no difference between the inner pressures of the upper and lower chambers UC and LC, the diaphragm 333 maintains its shape shown in FIG. 5(d). Therefore, the diaphragm 333 does not press the solar battery assembly A during pressurizing.

When the inner pressures of the upper and lower chambers UC and LC reach the atmospheric pressure, the inner pressure of the upper chamber UC is increased to be a positive pressure (a pressing pressure) by a compressor connected to the communicating path 331 of the moving plate body 331 while maintaining the inner pressure of the lower chamber LC at the atmospheric pressure (S7). At this time, as shown in FIG. 5(e), the upper chamber UC expands due to the difference between the upper and lower chambers, and the diaphragm 333 protrudes toward the lower chamber LC side and closely contacts the upper surface of the solar battery assembly A. Then, the diaphragm 333 presses, between the diaphragm 333 and the moving plate 320, the heated solar battery assembly A at a pressing pressure substantially equal to the difference between the inner pressures of the both chambers. At this time, almost all of the bubbles in the filler have already been removed, and the ambient air of the solar battery assembly A has become substantially equal to the atmospheric pressure. Therefore, the filler softened during the pressurizing is prevented from flowing out from an edge of the solar battery assembly A in accordance with expansion of the bubbles. Furthermore, since the diaphragm 333 has been heated to the appropriate temperature, the diaphragm 333 does not deprive the large amount of heat from the solar battery assembly through contact between the diaphragm 333 and the solar battery assembly A, and does not cause a nonuniform temperature distribution in the solar battery assembly A. Since the solar battery assembly A is pressed in a state of being heated to a substantially uniform temperature, it is possible to manufacture a solar battery panel having a uniform thickness and having a low degree of residual thermal stress.

When the hot-pressing executed for a predetermined time is finished, the inner pressure of the upper chamber UC is decreased to the atmospheric pressure (S8). When the inner pressure of the upper chamber UC is decreased to the atmospheric pressure, the shape of the diaphragm 333 returns to the state shown in FIG. 5(d). Then, the moving plate 330 moves upward, and the frame 332 departs from the thin plate 820 of the carrier plate 800 (S9). Next, when the conveyer 310 moves upward, and the thin plate 820 of the carrier plate 800 is lifted by the conveyer 310 and departs from the upper surface 321 of the fixed plate 320 (S10), the conveyer 310 is driven and the carrier plate 800 on which the solar battery assembly A after forming is placed is carried to the curing processing device 400 (S11).

Figure 7:
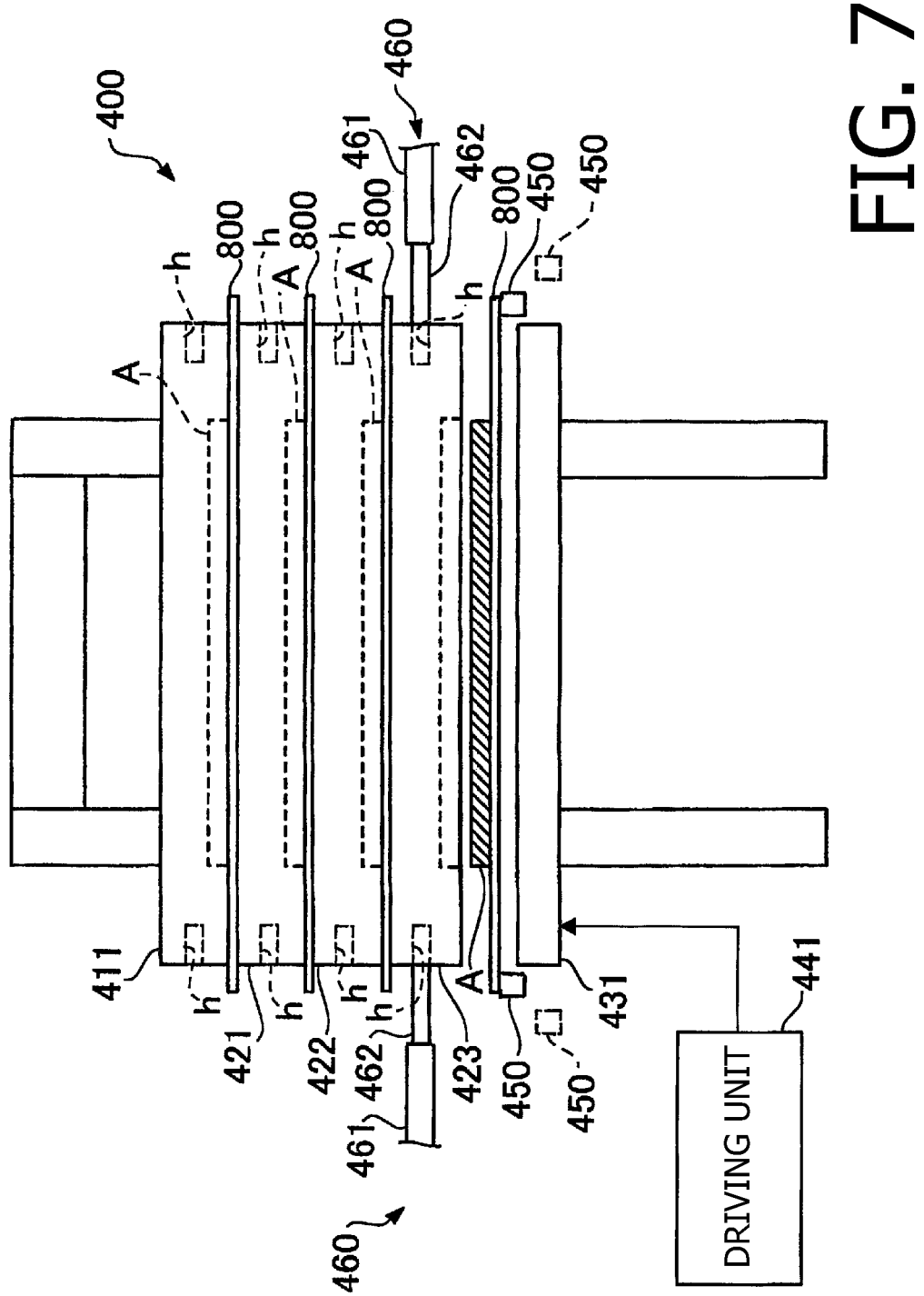
FIG. 7 is a front view of a curing processing device according to the embodiment of the invention.

Hereafter, the configuration of the curing processing device 400 according to the embodiment of the invention is explained. FIG. 7 is a front view of the curing processing device 400 viewed along the carrying direction. As shown in FIG. 7, the curing processing device 400 includes a top moving plate 411, a first intermediate moving plate 421, a second intermediate moving plate 422, a third intermediate moving plate 423 and a bottom moving plate 431 which are arranged in the vertical direction. Each carrier plate 800 on which the solar battery assembly A is placed is arranged between adjacent ones of the moving plates, and the curing processing device 400 is able to simultaneously execute the curing process for four solar battery assemblies at the maximum. The top moving plate 411, the first intermediate moving plate 421, the second intermediate moving plate 422 and the third intermediate moving plate 423 are provided to be movable in the vertical direction with respect to a frame of the curing processing device 400. Furthermore, the curing processing device 400 includes a driving unit 441 which drives the bottom moving plate 431 in the vertical direction with respect to the frame. The driving unit 441 has a driving mechanism (e.g., a lead screw mechanism) which is able to precisely control the height of the bottom moving plate 431.

Each of the top moving plate 411, the first intermediate moving plate 421, the second intermediate moving plate 422 and the third intermediate moving plate 423 has substantially the same structure as that of the moving plate 330 (FIG. 5) of the laminate press device 300. That is, each of the top moving plate 411 and the intermediate moving plates 421 to 423 has a built-in heater, and has a frame body having a lower surface to which the diaphragm 333 is adhered. To a communicating path formed in the frame body of each of the top moving plate 411 and the intermediate moving plates 421 to 423, a vacuum pump and/or a compressor (or a high pressure gas container) (not shown) for adjusting the air pressure of the upper and lower chambers UC and LC are connected.

The bottom moving plate 431 has substantially the same structure as that of the fixed plate 320 (FIG. 5) of the laminate press device 300. That is, the bottom moving plate 431 has a built-in heater.

When the solar battery assembly A is subjected to the curing process by the curing processing device 400, the bottom moving plate 431 is moved upward by the driving unit 441. When the bottom moving plate 431 moves upward, the third intermediate moving plate 423, the second intermediate moving plate 422, the first intermediate moving plate 421 and the top moving plate 411 are lifted sequentially. Then, each carrier plate 800 is sandwiched between moving plates situated on the upper side and the lower side thereof by the weight of each of the top moving plate 411 and the intermediate moving plates 421 to 423.

The solar battery assembly A is placed on and contacts each of the bottom moving plate 431 and the intermediate moving plates 421 to 423, and is heated via the carrier plate 800 by these moving plates from the lower side. Furthermore, by giving a higher pressure to the upper chamber UC relative to the lower chamber LC and pushing out the air from the lower chamber LC by the compressor in a state where the carrier plate 800 is sandwiched between the lower side moving plate (one of the bottom moving plate 431 and the intermediate moving plates 421 to 423) and the upper side moving plate (one of the intermediate moving plates 421 to 423 and the upper plate 411), the diaphragm 333 provided on the lower surface of the upper side moving plate (one of the intermediate plates 421 to 423 and the top moving plate 411) protrudes to the lower chamber LC side and closely contacts the solar battery assembly A. Each of the intermediate moving plates 421 to 423 and the top moving plate 411 is heated by the built-in heater, and the solar battery assembly A is heated also from the upper side due to the fact that the heat moves to the solar battery assembly A via air in the upper chamber UC and/or via the diaphragm 333 which has been heated before the curing process while closely contacting the upper side moving plate (one of the moving plates 421 to 423 and 411). As described above, the curing process for the solar battery assembly A is performed in the state where the solar battery assembly A is heated from both of the upper and lower side. Thus, a solar battery is formed.

Next, the configuration for placing the solar battery assemblies A between the moving plates of the curing processing device 400 and for retrieving the solar battery assemblies A from each moving plates is explained. The curing processing device 400 according to the embodiment includes a pair of conveyer 450. The pair of conveyers 450 receives, from the conveyer 310 (FIG. 4) of the laminate press device 300, the carrier plate 800 on which the solar battery assembly A before the curing process is placed, moves the carrier plate 800 to the moving plate of the cure processing device 400, and passes the carrier plate 800 on which the solar battery assembly A after the curing process is placed, to the carrying-out conveyer 500. The conveyer 450 is able to move between a carrying position (indicated by a solid line in FIG. 7) where the conveyer 450 is able to carry the carrier plate 800 and a retracted position (indicated by a dashed line in FIG. 7) which is shifted from the carrying position obliquely and downward to the outside in the width direction. The height of the conveyer 450 at the carrying position is set to be the same height of the conveyer 310 of the laminate press device 300 and the carrying-out conveyer 500.

In this embodiment, the carrier plate 800 on which the solar battery assembly A is placed can be moved and placed on a desired one of the intermediate moving plates 421 to 423 and the bottom moving plate 431. For this purpose, one of the upper surfaces of the intermediate moving plates 421 to 423 and the bottom moving plate 431 can be moved to have substantially the same height as that of the upper surface of the conveyer 450. Furthermore, the lower surface of a desired one of the top moving plate 411 and the intermediate moving plates 421 to 423 can be maintained at a predetermined height which is sufficiently higher than the upper surface of the conveyer 450. Therefore, by moving the bottom moving plate 431 by the driving unit 441 in the vertical direction so that a desired moving plate (one of the bottom moving plate 431 and the intermediate moving plates 421 to 423) has substantially the same height as that of the upper surface of the conveyer 450, and by further maintaining the lower surface of a moving plate (one of the top moving plate 411 and the intermediate moving plates 421 to 423) adjacent to the desired moving plate on the upper side at the predetermined height, a space for accommodating the carrier plate 800 on which the solar battery assembly A is placed can be secured between the upper surface of the desired moving plate and the lower surface of the moving plate on the upper side of the desired moving plate. By driving the conveyer 450 in this state, the carrier plate 800 on which the solar battery assembly A is placed can be moved to the desired moving plate. When the solar battery after the curing process is carried out, adjacent two moving plates sandwiching the carrier plate 800, on which the solar battery assembly to be carried out is placed, and the conveyer 450 are moved to the position set at the time of carrying-in. Thereafter, the carrier plate 800 is pushed out to the carrying-out conveyer 500 (see FIG. 1) by driving the conveyer 450. That is, by driving the conveyer 450, the solar battery assembly A before the curing process can be carried to the position between the moving plates and the solar battery after the curing process can be carried out from the position between the moving plates.

While the conveyer 450 is at the retraced position, the conveyer 450 does not contact the carrier plate 800 even when the moving plates sandwiching the carrier plate 800 are moved in the vertical direction.

Next, a holding mechanism for holding the top moving plate 411 and the intermediate moving plates 421 to 423 at the predetermined height is explained. As shown in FIG. 7, each of the top moving plate 411 and the intermediate moving plates 421 to 423 is provided with two pairs of engagement holes h (only one pair of engagement holes is illustrated in FIG. 7) arranged in the carrying direction at the both ends thereof in the width direction (in the left and right direction in FIG. 7). Furthermore, the curing processing device 400 includes two pairs of holding members 460 respectively corresponding to the two pairs of engagement holes h. Specifically, the holding members 460 are provided at positions which face the engagement holes h when the moving plate is arranged at the predetermined height.

Each of the holding members 460 has a cylinder 461 and a rod 462. The cylinder 461 is fixed to a support frame not shown. The rod 462 is configured to protrude to the inside from the cylinder 461 in the width direction, i.e., to the engagement hole h. The rod 462 is configured to be retractable between a fixing position (the state shown in FIG. 7) protruded from the cylinder 461 so that the tip of the rod 462 is inserted into the engagement hole h and a retracted position retracted into the cylinder 461 so that the tip of the rod 462 is pulled out from the engagement hole h of the moving plate. The rod 462 moves between the fixing position and the retracted position by a driving unit not shown of the holding member 460. The driving unit is configured to drive the rod 462 with a hydraulic pressure, an air pressure or a solenoid.

When one of the top moving plate 411 and the intermediate moving plates 421 to 423 is held at the predetermined height, the following process is executed. First, the bottom moving plate 431 is driven by the driving unit 441, and one of the moving plates is moved so that the engagement hole h thereof reaches the predetermined height. Next, when the rod 462 of the holding member 460 held at the predetermined height is moved from the retraced position to the fixing position, the rod 462 is inserted into the engagement hole h of the moving plate. As a result, the moving plate to which the rod 462 is inserted, other moving plates situated on the upper side of the moving plate, the carrier plate 800 and the solar battery assembly A are held on the holding member 460. When the bottom moving plate 431 is moved downward from this state by the driving unit 441, a lower side moving plate departs from the moving plate to which the rod 462 is inserted, and thereby a space is formed between the both moving plates.

Figure 8:
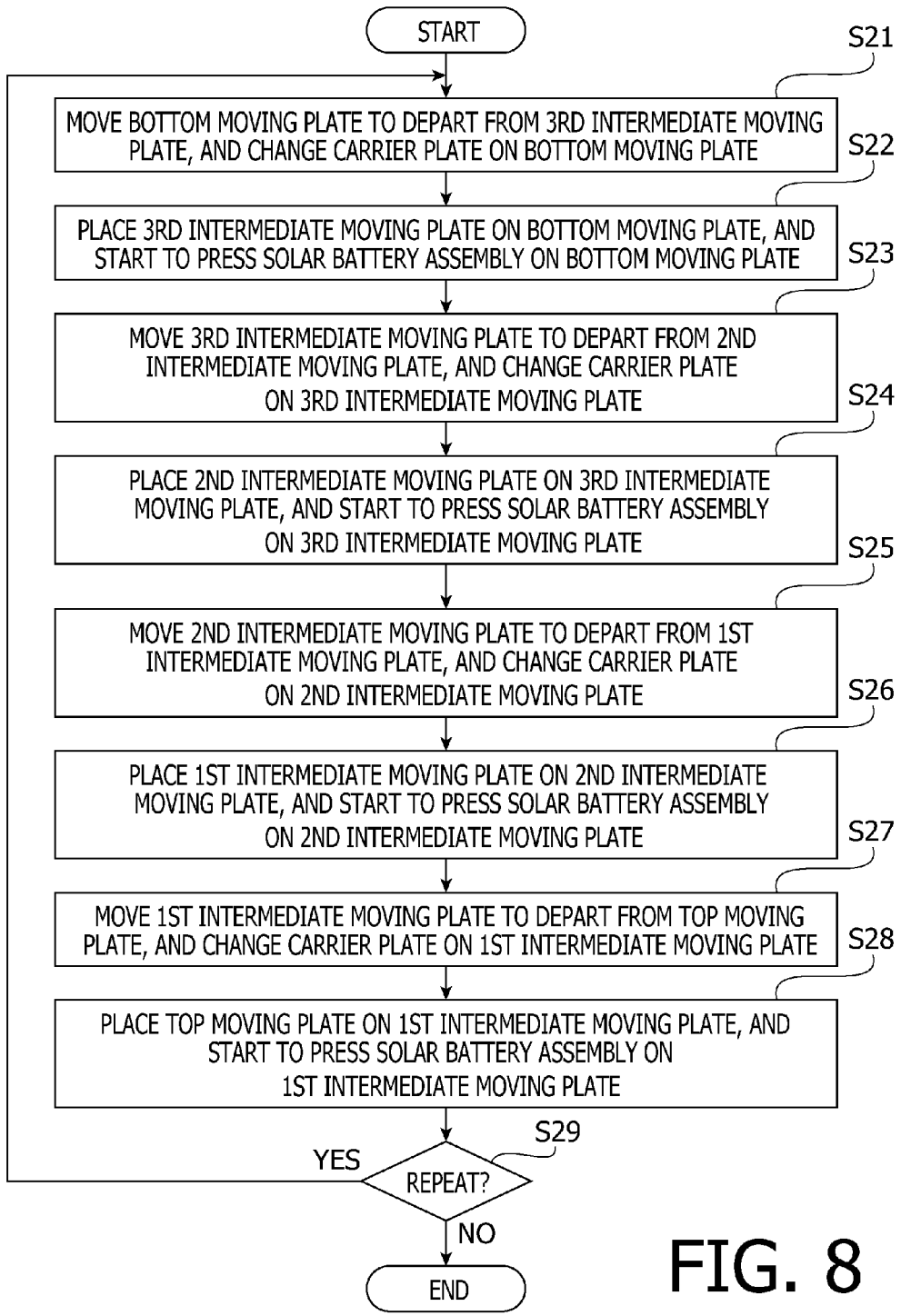
FIG. 8 is a flowchart illustrating a curing process according to the embodiment of the invention.

Next, the procedure of the curing process by the curing processing device 400 is explained. FIG. 8 is a flowchart illustrating the curing process executed by the curing processing device 400. The curing process is executed by the control device 700 (FIG. 1) of the laminating system 1 by controlling the components (including the conveyer 450, the driving unit 441 and the holding member 460) in the curing processing device 400. In this embodiment, the laminating time for the solar battery assembly A by the laminate press device (FIG. 5) is five minutes, and the carrier plate 800 on which the solar batten, assembly A is placed is sent to the curing processing device 400 every five minutes.

In the curing process, first, carrying-in and/or carrying-out of the carrier plate 800 to and/or from the upper surface of the bottom moving plate 431 is performed (S21). In step S21, first, the control device 700 drives the bottom moving plate 431 of the curing processing device 400 to move the third intermediate moving plate 423 so that the engagement hold h of the third intermediate moving plate 423 has the height equal to the height of the rod 462. Next, the control device 700 moves the rod 462 of the holding member 460 from the retracted position to the fixing position, and inserts the tip of the rod 462 into the engagement hole h of the third intermediate moving plate 423. Then, the control device 700 drives again the bottom moving plate 431 so that the upper surface of the bottom moving plate 431 is lowered to a position which is lower than the upper surface of the conveyer 450 of the carrying position. At this time, a space for carrying-in and/or carrying-out of the carrier plate 800 is formed between the upper surface of the bottom moving plate 431 and the lower surface of the third intermediate moving plate 423. Then, the control device 700 carries the conveyer 450 from the retraced position to the carrying position, and thereafter the control device 700 drives the conveyer 450 to carry out the carrier plate 800 on which the solar battery after the curing process is placed from the space between the moving plates, and carries in the carrier plate 800 on which the solar battery assembly A before the curing process is placed to the space between the moving plates. Consequently, the curing processing device 400 becomes the state shown in FIG. 7. Thus, step S21 is finished.

In step S22, first, the control device 700 moves the carrier plate 800 carrying the solar battery assembly A on the conveyer 450 to the position on the bottom moving plate 431 by moving upward the bottom moving plate 431, and thereafter the control device 700 moves the conveyer 450 from the carrying position to the retracted position. Then, the control device 700 further moves upward the bottom moving plate 431 so that the carrier plate 800 placed on the bottom moving plate 431 is sandwiched between the bottom moving plate 431 and the third intermediate moving plate 423. Then, the control device 700 moves the rod 462 of the holding member 460 from the fixing position to the retracted position so as to pull out the tip of the rod 462 from the engagement hole h of the third intermediate moving plate 423. Next, the control device 700 drives the vacuum pump and/or the compressor connected to the third intermediate moving plate 423 so as to cause the diaphragm to press the solar battery assembly A. The state is maintained, for example, for five minutes, until the next step S23 starts. It should be noted that the third intermediate moving plate 423 is placed on the bottom moving plate 431 until the process returns to step S21 again via steps S23 to S29 which are described later, and the curing process for the solar battery assembly A placed on the upper surface of the bottom moving plate 431 continues.

In the next step S23, carrying-in and/or carrying-out of the carrier plate 800 to and/or from the upper surface of the third intermediate moving plate 423 is performed. In step S23, by initially driving the bottom moving plate 431 of the curing processing device 400, the control device 700 moves the second intermediate moving plate 422 to the position at which the engagement hole h of the second intermediate moving plate 422 has the same height as that of the rod 462 of the holding member 460. Then, the control device 700 moves the rod 462 of the holding member 460 from the retracted position to the fixing position so as to insert the tip of the rod 462 to the engagement hole h of the second moving plate 422. Then, by driving again the bottom moving plate 431, the control device 700 lowers the upper surface of the third intermediate moving plate 423 to a position lower than the upper surface of the conveyer 450. At this time, a space for carrying-in and/or carrying-out of the carrier plate 800 is formed between the upper surface of the third intermediate moving plate 423 and the lower surface of the second intermediate moving plate 422. Next, after moving the conveyer 450 from the retracted position to the carrying position, the control device 700 carries out the carrier plate 800 on which the solar battery after the curing process is placed from the space between the moving plates by driving the conveyer 450, and carries in the carrier plate 800 on which the solar battery assembly A before the curing process is placed to the space between the moving plates. Thus, step S23 is completed.

In step S24, by initially moving upward the bottom moving plate 431, the control device 700 moves the carrier plate 800 carrying the solar battery assembly A on the conveyer 450 to the position on the third intermediate moving plate 423. When the solar battery assembly A is moved to the position on the third intermediate moving plate 423, the control device 700 moves the conveyer 450 from the carrying position to the retracted position. Then, the control device 700 moves upward the bottom moving plate 431 so that the carrier plate 800 placed on the third intermediate moving plate 423 is sandwiched between the third intermediate moving plate 423 and the second intermediate moving plate 422. Next, the control device 700 moves the rod 462 of the holding member 460 from the fixing position to the retracted position so as to pull out the tip of the rod 462 from the engagement hole h of the second intermediate moving plate 422. Next, the control device 700 drives the vacuum pump and/or the compressor connected to the second intermediate moving plate 422 so as to cause the diaphragm to press the solar battery assembly A. The state is maintained, for example, for five minutes, until the next step S25 starts. It should be noted that the second intermediate moving plate 422 is placed on the third intermediate moving plate 423 and the curing process for the solar battery assembly A placed on the second intermediate moving plate 422 continues until the process returns to step S23 again via steps S25 to S29 which are described later and steps S21 to S22.

In the next step S25, carrying-in and/or carrying-out of the carrier plate 800 to and/or from the upper surface of the second intermediate moving plate 422 is performed. In step S25, by initially driving the bottom moving plate 431 of the curing processing device 400, the control device 700 moves the first intermediate moving plate 421 to the position at which the engagement hole 11 of the first intermediate moving plate 421 has the same height as that of the rod 462 of the holding member 460. Then, the control device 700 moves the rod 462 of the holding member 460 from the retracted position to the fixing position so as to insert the tip of the rod 462 to the engagement hole 11 of the first moving plate 421. Then, by driving again the bottom moving plate 431, the control device 700 lowers the upper surface of the second intermediate moving plate 422 to a position lower than the upper surface of the conveyer 450. At this time, a space for carrying-in and/or carrying-out of the carrier plate 800 is formed between the upper surface of the second intermediate moving plate 422 and the lower surface of the first intermediate moving plate 421. Next, after moving the conveyer 450 from the retracted position to the carrying position, the control device 700 carries out the carrier plate 800 on which the solar battery after the curing process is placed from the space between the moving plates by driving the conveyer 450, and carries in the carrier plate 800 on which the solar battery assembly A before the curing process is placed to the space between the moving plates. Thus, step S25 is completed.

In step S26, by initially moving upward the bottom moving plate 431, the control device 700 moves the carrier plate 800 carrying the solar battery assembly A on the conveyer 450 to the position on the second intermediate moving plate 422, and then moves the conveyer 450 from the carrying position to the retracted position. Then, the control device 700 moves upward the bottom moving plate 431 so that the carrier plate 800 placed on the second intermediate moving plate 422 is sandwiched between the second intermediate moving plate 422 and the first intermediate moving plate 421. Next, the control device 700 moves the rod 462 of the holding member 460 from the fixing position to the retracted position so as to pull out the tip of the rod 462 from the engagement hole h of the first intermediate moving plate 421. Next, the control device 700 drives the vacuum pump and/or the compressor connected to the first intermediate moving plate 421 so as to cause the diaphragm to press the solar battery assembly A. This state is maintained, for example, for five minutes, until the next step S27 starts. It should be noted that the first intermediate moving plate 421 is placed on the second intermediate moving plate 422 and the curing process for the solar battery assembly A placed on the second intermediate moving plate 422 continues until the process returns to step S25 again via steps S27 to S29 which are described later and steps S21 to S24.

In the next step S27, carrying-in and/or carrying-out of the carrier plate 800 to the upper surface of the first intermediate moving plate 421 is performed. In step S27, by initially driving the bottom moving plate 431 of the curing processing device 400, the control device 700 moves the first intermediate moving plate 421 to the position at which the engagement hole h of the top moving plate 411 has the same height as that of the rod 462 of the holding member 460. Then, the control device 700 moves the rod 462 of the holding member 460 from the retracted position to the fixing position so as to insert the tip of the rod 462 to the engagement hole h of the top moving plate 411. Then, by driving again the bottom moving plate 431, the control device 700 lowers the upper surface of the first intermediate moving plate 421 to a position lower than the upper surface of the conveyer 450. At this time, a space for carrying-in and/or carrying-out of the carrier plate 800 is formed between the upper surface of the first intermediate moving plate 421 and the lower surface of the top moving plate 411. Next, after moving the conveyer 450 from the retracted position to the carrying position, the control device 700 carries out the carrier plate 800 on which the solar battery after the curing process is placed from the space between the moving plates by driving the conveyer 450, and carries in the carrier plate 800 on which the solar battery assembly A before the curing process is placed to the space between the moving plates. Thus, step S27 is completed.

In step S28, by initially moving upward the bottom moving plate 431, the control device 700 moves the carrier plate 800 carrying the solar battery assembly A on the conveyer 450 to the position on the first intermediate moving plate 421. When the solar battery assembly A moves to the position on the first intermediate moving plate 421, the control device 700 moves the conveyer 450 from the carrying position to the retracted position. Then, the control device 700 moves upward the bottom moving plate 431 so that the carrier plate 800 placed on the first intermediate moving plate 421 is sandwiched between the first intermediate moving plate 421 and the top moving plate 411. Next, the control device 700 moves the rod 462 of the holding member 460 from the fixing position to the retracted position so as to pull out the tip of the rod 462 from the engagement hole h of the top moving plate 411. Next, the control device 700 drives the vacuum pump and/or the compressor connected to the top moving plate 411 so as to cause the diaphragm to press the solar battery assembly A. This state is maintained, for example, for five minutes, until the next step S29 starts. It should be noted that the top moving plate 411 is placed on the first intermediate moving plate 421 and the curing process for the solar battery assembly A placed on the first intermediate moving plate 421 continues until the process returns to step S27 again via steps S29 which is described later and steps S21 to S26.

In step S29, it is judged whether to repeat the operation of the above described steps S21 to S28. Whether to repeat the steps may be determined based on instructions from an operator through an input unit not shown, or may be determined whether the repeat count recorded by a counter reaches a predetermined number of times. When the operation is to be repeated (step S29: YES), the process returns to step S21. When the operation is not to be repeated (step S29: NO), the flowchart terminates.

When the operation is to be repeated, the solar battery assembly A arranged between the bottom moving plate 431 and the third intermediate moving plate 423 in the previous execution of step S21 is carried out by the conveyer 450 as a solar batter after the curing process. The carrier plate 800 on which the solar battery after the curing process carried out by the conveyer 450 is placed is passed to the carrying conveyer 500 (FIG. 1), and is sent to the stocker (not shown) by the carrying conveyer 500.

Through the above described routine, one solar batter assembly A is pressed by the curing processing device 400 while the four cycles of the lamination pressing is repeated (i.e., for about twenty minutes). On the other hand, the curing processing device 400 is able to perform, about every five minutes, the process where a new solar battery assembly A is carried in and the solar battery assembly A after the curing process is carried out. Therefore, in this embodiment, it is possible to start, at an appropriate time (e.g., about every five minutes), the laminate pressing for the solar battery assembly A for which lamination pressing having a short processing time is finished while securing an adequate period of time for the curing process for each solar battery assembly A.

The foregoing is the embodiment of the invention. However, it is understood that embodiments of the invention are not limited to the above described configuration, and can be varied within the scope of the invention described in the claims.

For example, although, in the laminate press device according to the embodiment, the inner pressure of the chamber in which the work piece is placed is maintained at the atmospheric pressure during the hot-pressing, the inner pressure during the hot-pressing may be set to be higher than or equal to the atmospheric pressure. However, if the inner pressure during the hot-pressing is excessively high, a possibility arises that the compressed gas remains in the laminate structure body after the processing and thereby the adhered parts are broken away. Therefore, it is preferable that the inner pressure of the chamber in which the work piece is placed is set to a pressure lower than or equal to 2 atm, or preferably set to a pressure lower than or equal to 1.5 atm. Furthermore, the advantage of the invention can also be achieved even when the inner pressure of the chamber in which the work piece is placed is set to be slightly lower than the atmospheric pressure during the hot-pressing. Specifically, by setting the inner pressure during the hot-pressing to be higher than or equal to 0.1 atm, a certain degree of effect of preventing flowing out of the filler can be achieved. However, in order to obtain adequate advantages, it is preferable that the inner pressure of the chamber in which the work piece is placed during the hot-pressing is set to be higher than or equal to 0.5 atm or more preferably set to be higher than or equal to 0.8 atm.

Although, in the laminate press device according to the embodiment, the work piece is placed in the lower chamber LC, the work piece may be placed in the upper chamber UC. In this case, the diaphragm is fixed to the lower chamber LC, and the upper chamber UC is configured to be openable and closable. The work piece is placed, for example, on the diaphragm. The inner pressures of the chambers are controlled in a reverse way in comparison with the above described embodiment. That is, the inner pressure of the lower chamber LC is set to a positive pressure while maintaining the inner pressure of the upper chamber UC at the atmospheric pressure so that the diaphragm protrudes to the upper chamber UC side and the work piece is pressed between the ceiling surface of the upper chamber and the diaphragm. In this case, a moving platen may be additionally provided between the diaphragm and the work piece so that the work piece is hot-pressed between the moving platen and the ceiling surface of the upper chamber UC.

The laminate press device according to the above described embodiment employs the configuration where the lower chamber is supported by the fixed plate and the upper chamber UC is supported by the moving plate. However, the lower chamber LC and the upper chamber UC may be supported respectively by the moving plate and the fixed plate. Alternatively, both of the chambers may be supported separate moving plates.

It is preferable that the work piece is not actually pressed by the diaphragm until the work piece is hot-pressed. The laminate press device according to the above describe embodiment employs the configuration where the inner pressures of both of the upper and lower chambers UC and LC are increased to the atmospheric pressure in the state where the inner pressure of the upper chamber UC and the inner pressure of the lower chamber are balanced. However, another control of the inner pressures may be employed. By constantly maintaining the inner pressure of the lower chamber LC to be higher than or substantially equal to the inner pressure of the upper chamber UC, it is possible to prevent the work piece from being actually pressed by the diaphragm. For example, the inner pressure of the lower chamber LC in which the work piece is placed may be increased to the atmospheric pressure while keeping the upper chamber UC at the decreased pressure, and thereafter the upper chamber UC may be pressurized. Such a control also makes it possible to prevent the softened filler from flowing out from the work piece due to the fact that the work piece is hot-pressed in the vacuum state.

In the above described embodiment, the curing processing device 400 is configured to have three intermediate moving plates, and to be able to execute the curing process for four solar battery assemblies A simultaneously. However, the present invention is not limited to such a configuration. For example, when the curing process requires a longer time, solar batteries can be effectively manufactured by using a curing processing device having a larger number of intermediate moving plates.

In the above described embodiment, each of the moving plates 411, 421, 422, 423 and 431 of the curing processing device 400 and the fixed plate 320 and the moving plate 330 of the laminate press device 300 is heated by the electrothermal heater provided therein. However, each of the moving plates and the fixed plate may be configured to be heated by a heat medium (e.g., oil) circulating therein. It should be noted that since the way of using the thermal heater according to the embodiment does not raise a possibility of producing oil mist, the embodiment can be used in a clean room.

In the above described embodiment, the control of the laminate press process and the curing process are controlled by the control device 700 which is provided separately from the laminate press device 300 and the curing processing device 400. However, the laminate press device 300 and the curing processing device 400 may be respectively provided with control units so that the laminate press process and the curing process can be executed under control of these control units. In the above described embodiment, cooperation between devices is controlled by the control device 700. However, cooperation between the devices may be achieved through communication between control units provided respectively in the devices of the laminate processing system 1 without providing the control device 700 executing central control for the laminate processing system 1.

Although the above described embodiment is an example in which the present invention is applied to the manufacturing of solar battery panels, the present invention can also be applied to various types of forming of a laminate structure body. For example, the present invention can be applied to manufacturing of a plate-like laminate structure body, such as a print wiring board which is formed by hot-pressing a laminated body of structural materials including pre-preg. The present invention can also be applied to manufacturing of display panels, such as a plasma display panel and an organic electro luminescent display.

What is claimed is:

1. A curing processing device executing a curing process for a solar battery assembly formed by perfuming laminate press for stacked structural components of a solar battery so as to heat the solar battery assembly and thereby to thermally stabilize the solar battery assembly, the curing processing device comprising:
a top moving plate;
a bottom moving plate arranged under the top moving plate;
at least one intermediate moving plate arranged between the top moving plate and the bottom moving plate,
a heating unit which heats each of the top moving plate, the bottom moving plate and the at least one intermediate moving plate;
a moving plate driving unit which drives the bottom moving plate in a vertical direction;
a carrying unit which arranges the solar battery assembly at a position between the moving plates, and retrieves the solar batter assembly from the moving plates; and
a controller, wherein:
each of the top moving plate and the at least one intermediate moving plate includes an elastic film on a lower surface thereof and a positive pressure applying unit which applies a positive pressure to a space between the lower surface and the elastic film;
the controller is configured to cause the curing processing device to operate in a carrying mode in which the controller selects a pair of moving plates, adjoining in a vertical direction, from the top moving plate, the at least one intermediate moving plate and the bottom moving plate, selectively increases an interval between the selected pair of moving plates, and carries in or carries out the solar battery assembly to or from a position between the pair of moving plates, and a compress mode in which the bottom moving plate is moved upward so that the solar battery assembly is sandwiched between the pair of moving plates and then, by driving the positive pressure applying unit, a positive pressure is applied to the space between a lower surface of an upper side moving plate and the elastic film of the upper side moving plate to cause the elastic film to press the solar batter assembly; and
the controller changes a pair of moving plates selected in the carrying mode in a predetermined order each time the carrying mode and the compress mode is switched.

2. The curing processing device according to claim 1, further comprising:
a moving plate holding unit which fixes one of the at least one intermediate moving plate and the top moving plate so that the one of the at least one intermediate moving plate and the top moving plate is prevented from becomes lower than or equal to a predetermined height,
wherein, in the carrying mode, the controller controls the moving plate holding unit so that an upper side moving plate of the selected pair of moving plate is fixed, and the interval between the selected pair of moving plates is increased by lowering the bottom moving plate.

3. The curing processing device according to claim 2, wherein:
a hole is formed on a side surface of each of the at least one intermediate moving plate and the top moving plate to extend in a substantially horizontal direction;
the moving plate holding unit comprises a fixed part fixed at the predetermined height, a rod configured to be retractable with respect to the fixed part, and a driving unit which drives the rod; and
each moving plate is fixed at the predetermined height by causing the rod to protrude from the fixed part and thereby to be inserted into the hole of each moving plate.

4. The curing processing device according to claim 1, wherein:
the carrying unit includes a conveyer provided at both sides of the solar battery assembly in a width direction which is perpendicular to a carrying direction of the solar batter assembly and the vertical direction;
the conveyer is movable between a carrying position where the conveyer is able to carry the solar battery assembly and a retracted position which is shifted from the carrying position in the width direction and at which the conveyer does not interfere with the solar battery assembly;
the controller moves the conveyer to the retracted position after the solar batter assembly is moved to a position on each moving plate from the conveyer.

5. A curing processing device for executing a curing process for a lamination body formed by performing laminate press for stacked structural components of a laminate structure body so as to heat and stabilize the lamination body, the curing processing device comprising:
- a top moving plate;
- a bottom moving plate arranged under the top moving plate;
- at least one intermediate moving plate arranged in a vertical direction between the top moving plate and the bottom moving plate;
- a diaphragm arranged between the moving plates;
- a moving plate interval elongation mechanism which moves a pair of moving plates, which are adjacent ones of the top moving plate, the bottom moving plate and the at least one intermediate moving plate, to depart from each other; and
- an inner pressure control unit which controls an inner pressure of a chamber which is formed between the moving plates when the pair of moving plates do not departed from each other and which is comparted by the diaphragm, wherein at least one of the pair of moving plates includes a heater, and wherein the curing process is performed by sandwiching the lamination body between the diaphragm and the at least one of the pair of moving plates including the heater while controlling the inner pressure.

6. The curing processing device according to claim 5, wherein the moving plate interval elongation mechanism comprises:

- a moving plate driving unit which drives the bottom moving plate in the vertical direction; and
- a holding unit which holds one of the top moving, plate and the at least one intermediate moving plate at a predetermined height.

7. The curing processing device according to claim 6, wherein the moving plate interval elongation mechanism causes the moving plate driving unit to move an upper side one of the pair of moving plates adjacent to each other to the predetermined height while driving the bottom moving plate, causes the holding unit to hold the upper side one of the pair of moving plates at the predetermined height, and causes the pair of moving plates adjacent to each other to depart from each other by causing the moving plate driving unit to lower the other of the pair of moving plates while driving the bottom moving plate.

8. The curing processing device according to claim 5, wherein the laminate structure body is a solar battery, and the lamination body is a solar battery assembly formed by stacking components of the solar battery.

9. A laminating system, comprising:
- a laminate press device which heats and presses a lamination body to form a laminate structure body; and
- a curing processing device according to claim 1, wherein the curing processing device executes a curing process in which the laminate structure body is heated and stabilized.

* * * * *